United States Patent
Messenger et al.

(10) Patent No.: US 8,723,243 B2
(45) Date of Patent: May 13, 2014

(54) POLYSILICON/METAL CONTACT RESISTANCE IN DEEP TRENCH

(71) Applicant: International Business Machines Corporation, Armonk, NY (US)

(72) Inventors: Brian W. Messenger, Newburgh, NY (US); Paul C. Parries, Wappingers Falls, NY (US); Chengwen Pei, Danbury, CT (US); Geng Wang, Stormville, NY (US); Yanli Zhang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/071,152

(22) Filed: Nov. 4, 2013

(65) Prior Publication Data

US 2014/0054664 A1 Feb. 27, 2014

Related U.S. Application Data

(62) Division of application No. 13/307,874, filed on Nov. 30, 2011.

(51) Int. Cl.
*H01L 27/108* (2006.01)
(52) U.S. Cl.
USPC .................................. 257/301; 257/E27.092
(58) Field of Classification Search
USPC .......................................... 257/301, E27.092
See application file for complete search history.

(56) References Cited

U.S. PATENT DOCUMENTS

| | | |
|---|---|---|
| 4,918,502 A | 4/1990 | Kaga et al. |
| 5,283,453 A | 2/1994 | Rajeevakumar |
| 5,618,751 A | 4/1997 | Golden et al. |
| 5,940,717 A | 8/1999 | Rengarajan et al. |
| 6,255,683 B1 | 7/2001 | Radens et al. |
| 6,258,689 B1 | 7/2001 | Bronner et al. |
| 6,340,615 B1 | 1/2002 | Iyer et al. |
| 6,534,814 B2 | 3/2003 | Iba et al. |
| 6,613,672 B1 | 9/2003 | Wang et al. |
| 6,737,316 B2 | 5/2004 | Lee |
| 6,750,096 B2 | 6/2004 | Steck et al. |
| 6,953,724 B2 | 10/2005 | Edelman et al. |
| 6,979,613 B1 | 12/2005 | Wu et al. |

(Continued)

OTHER PUBLICATIONS

Koester, S. J., et al., "Wafer-level 3D integration technology", IBM J. Res. & Dev., Nov. 2008, vol. 52, No. 6.

(Continued)

*Primary Examiner* — Lex Malsawma
(74) *Attorney, Agent, or Firm* — Scully, Scott, Murphy & Presser, P.C.; Joseph P. Abate, Esq.

(57) ABSTRACT

A method of forming a trench structure that includes forming a metal containing layer on at least the sidewalls of a trench, and forming an undoped semiconductor fill material within the trench. The undoped semiconductor fill material and the metal containing layer are recessed to a first depth within the trench with a first etch. The undoped semiconductor fill material is then recessed to a second depth within the trench that is greater than a first depth with a second etch. The second etch exposes at least a sidewall portion of the metal containing layer. The trench is filled with a doped semiconductor containing material fill, wherein the doped semiconductor material fill is in direct contact with the at least the sidewall portion of the metal containing layer.

16 Claims, 6 Drawing Sheets

(56) References Cited

U.S. PATENT DOCUMENTS

| | | | |
|---|---|---|---|
| 7,078,291 B2 | 7/2006 | Hsu | |
| 7,388,244 B2 * | 6/2008 | Ho et al. | 257/301 |
| 7,550,359 B1 | 6/2009 | Cheng et al. | |
| 7,833,895 B2 | 11/2010 | Bonifield et al. | |
| 7,888,723 B2 | 2/2011 | Brodsky et al. | |
| 2002/0153590 A1 * | 10/2002 | Kunikiyo | 257/532 |
| 2005/0070064 A1 | 3/2005 | Edleman et al. | |
| 2005/0196932 A1 | 9/2005 | Divakaruni et al. | |
| 2005/0287718 A1 * | 12/2005 | Berndlmaier et al. | 438/149 |
| 2007/0057302 A1 * | 3/2007 | Ho et al. | 257/301 |
| 2007/0218625 A1 * | 9/2007 | Ho et al. | 438/243 |
| 2009/0079027 A1 * | 3/2009 | Cheng et al. | 257/522 |
| 2009/0079030 A1 * | 3/2009 | Cheng et al. | 257/532 |
| 2009/0159948 A1 * | 6/2009 | Ho et al. | 257/301 |
| 2009/0173980 A1 * | 7/2009 | Cheng et al. | 257/301 |
| 2009/0184356 A1 * | 7/2009 | Brodsky et al. | 257/301 |
| 2009/0184357 A1 * | 7/2009 | Wu | 257/303 |
| 2009/0184392 A1 * | 7/2009 | Cheng et al. | 257/532 |
| 2009/0236691 A1 * | 9/2009 | Dyer et al. | 257/532 |
| 2009/0278238 A1 | 11/2009 | Bonifield et al. | |
| 2010/0032764 A1 | 2/2010 | Andry et al. | |
| 2010/0130002 A1 | 5/2010 | Dao et al. | |
| 2011/0018107 A1 | 1/2011 | Bonifield et al. | |

OTHER PUBLICATIONS

Cai, Will Z., et al., "RF Characteristics of a High-Performance, 10-fF/µm2", IEEE Electron Device Letters, Jul. 2004, vol. 25.

* cited by examiner

POLYSILICON/METAL CONTACT RESISTANCE IN DEEP TRENCH

CROSS REFERENCE TO RELATED APPLICATION

This application is a divisional of U.S. patent application Ser. No. 13/307,874, filed Nov. 30, 2011 the entire content and disclosure of which is incorporated herein by reference.

BACKGROUND

The present disclosure generally relates to trench structures, such as trench capacitors and through silicon via structures.

Embedded DRAM devices may include trench capacitors. A trench capacitor is a three dimensional device that can be formed by etching a trench into a semiconductor substrate. After trench etching, a buried plate electrode, also referred to as a diffusion plate, is typically formed about the exterior portion of the trench and a node dielectric is then formed on the inner walls of the trench. Next, the trench can be filled, for example, with doped polysilicon, such as N-type polycrystalline silicon ("N-type Poly-Si"). The doped poly-Si serves as one electrode of the capacitor, often referred to as the upper electrode or storage node, and the buried plate electrode serves as a second electrode of the capacitor, often referred to as the lower electrode. The node dielectric separates the buried plate and the upper electrode, and serves as the insulating layer of the trench capacitor.

Microelectronic devices are typically connected and interconnected using patterned conductor layers that are separated by dielectric layers. In addition to the connection and interconnection of microelectronic devices within a microelectronic structure using patterned conductor layers that are separated by dielectric layers, microelectronic structures, and in particular semiconductor structures, also frequently use through substrate via structures that provide an electrical connection from a top side to a bottom side of a microelectronic substrate, such as a semiconductor substrate.

SUMMARY

A method for forming a trench structure is provided for a semiconductor device, interconnect and/or memory device. In one embodiment, the method of forming the trench structure includes forming a trench into a semiconductor substrate, and forming a metal containing layer on at least the sidewalls of the trench. An undoped semiconductor fill material is then deposited within the trench. A first etch recesses the undoped semiconductor fill material, and the metal containing layer to a first depth within the trench. A second etch recesses the undoped semiconductor containing fill material to a second depth within the trench that is greater than a first depth to expose at least a sidewall portion of the metal containing layer. The second etch is selective to at least the metal containing layer. A doped semiconductor containing fill is formed in the trench, wherein the doped semiconductor fill material is in direct contact with the at least the sidewall portion of the metal containing layer that has been exposed by the second etch that recessed the undoped semiconductor fill material.

In another embodiment, the method of forming the trench structure includes forming a trench into a semiconductor substrate. A dielectric layer is then formed on the sidewalls of the trench. A metal containing layer is then formed on the dielectric layer. An undoped semiconductor fill material is then deposited within the trench. A first etch recesses the undoped semiconductor fill material and the metal containing layer to a first depth within the trench. The first etch may be selective to the dielectric layer. A second etch recesses the undoped semiconductor fill material to a second depth within the trench that is greater than a first depth to expose at least a sidewall portion of the metal containing layer. The second etch may be selective to the metal containing layer and the dielectric layer. The dielectric layer is then etched with a third etch that is selective to the metal containing layer and the undoped semiconductor fill material. A doped semiconductor fill material is formed in the trench, wherein the doped semiconductor fill material is in direct contact with the at least the sidewall portion of the metal containing layer that has been exposed by the second etch that recessed the undoped semiconductor fill material.

In another embodiment, the method of forming the trench structure includes forming a trench into a semiconductor substrate, and forming a dielectric layer on at least the sidewalls of the trench. A metal containing layer is then formed within the trench on the dielectric layer. An undoped semiconductor fill material is then deposited within the trench. A first etch recesses the undoped semiconductor fill material within the trench, wherein the first etch is selective to at least the metal containing layer. A second etch recesses the metal containing layer and the dielectric layer within the trench to a depth that is less than a recessed depth of the undoped semiconductor fill material, wherein the second etch is selective to the undoped semiconductor fill material. A doped semiconductor fill material is formed in the trench, wherein the doped semiconductor fill material is in direct contact with the at least the sidewall portion of the metal containing layer that extends above the recessed undoped semiconductor fill material.

In another embodiment, the method of forming the trench structure includes forming a trench into a semiconductor substrate, and forming a dielectric layer on at least the sidewalls of the trench. A metal containing layer is then formed within the trench on the dielectric layer. An undoped semiconductor fill material is then deposited within the trench. A first etch recesses the undoped semiconductor fill material to a first depth within the trench, wherein the first etch is selective to at least the metal containing layer. A first doped semiconductor fill material is then deposited within the trench atop the undoped semiconductor fill material. A second etch recesses the first doped semiconductor fill material to a second depth within the trench that is less than the first depth within the trench. The second etch is selective to at least the metal containing layer. A third etch recesses the metal containing layer and the dielectric layer within the trench to a third depth that is less than the first depth. The third etch may be selective to the first doped semiconductor fill material. A second doped semiconductor fill material is formed in the trench on the first doped semiconductor fill material.

In another aspect, a trench structure is provided that includes a trench in a semiconductor on insulator (SOI) substrate, wherein the trench extends from a surface of an semiconductor on insulator (SOI) layer of the SOI substrate through a buried dielectric layer of the SOI substrate into the base semiconductor layer of the SOI substrate. An undoped semiconductor fill material is present in a lower portion of the trench that is present into the base semiconductor layer. A dielectric layer is present on the sidewalls of the trench extending from a portion of the buried dielectric layer into the base semiconductor layer, and a metal containing layer is present on the dielectric layer, wherein a contact portion of the metal containing layer extends from an upper surface of the undoped semiconductor fill material. A doped semiconductor fill material is present in the trench extending from an upper portion of the trench that is present through the SOI layer of the SOI substrate into contact with the contact portion of the metal containing layer.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Detailed embodiments of the present disclosure are disclosed herein; however, it is to be understood that the disclosed embodiments are merely illustrative and may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The embodiments of the present disclosure relate to methods for producing low resistance contacts to electrically conductive elements that are contained within a high aspect ratio, deep trench structure. A trench with a high aspect ratio is a trench having an aspect ratio that is greater than 20:1. A deep trench is typically a trench having a depth of at least one micron, as measured from the upper surface of the semiconductor substrate. In one embodiment, the trench structure is the capacitor of a memory device, and the electrically conductive element that is being contained within the trench structure to which the low resistance contact is being made is an electrode. The term "electrode" as used to describe a component of the capacitor represents one of at least two electrically conductive materials of the capacitor that are separated by a dielectric layer, e.g., node dielectric layer. In another embodiment, the trench structure may be a through substrate via (TSV) structure, and the electrically conductive element that is being contained within the trench structure to which the low resistance contact is being made is a conductor for transmitting current from one side of the substrate to the other. In one embodiment, the TSV structure is a through silicon via, which is a vertical electrical connection (via) passing completely through a silicon wafer, or a 3D package. Capacitors and TSV structures are only two examples of structures that may be provided by the methods and structures of the present disclosure. Applicants submit that capacitors and TSV structures are provided for illustrative purposes only and are not intended to limit the present disclosure to only the specifically described embodiments, as any trench structure that includes contacts to electrically conductive elements contained within a trench is suitable for the methods and structures disclosed herein.

In some capacitors and TSV structures, a dielectric layer and a metal containing layer is formed on the sidewalls and base of the trench followed by a fill of an undoped semiconductor fill material. The dielectric layer, the metal containing layer and the undoped semiconductor fill material are then recessed within the trench. A doped semiconductor fill material is then deposited to fill the trench, wherein the doped semiconductor material is in direct contact with the recessed surfaces of the undoped semiconductor material, the dielectric layer and the metal containing layer. The doped semiconductor fill material layer is the contact to the metal containing layer that is present in the trench. As noted above, in the embodiments in which the trench structure is a capacitor, the metal containing layer is an electrode to the capacitor, and in the embodiments in which the trench structure is a TSV structure, the metal containing layer is a conductor for transmitting current from one side of the substrate to the other side of the substrate. It has been determined that when the doped semiconductor fill material is in direct contact with only the upper surface of the recessed metal containing layer, wherein the entire sidewall of the recessed metal containing layer is covered by the undoped semiconductor fill material, the contact between the doped semiconductor fill material and the recessed metal containing layer has a particularly high contact resistance. For example, the contact resistance between the doped semiconductor fill material and the recessed metal containing layer, wherein the doped semiconductor fill material is only in contact with an upper surface of the recessed metal containing layer, is typically greater than 8 k$\Omega$. As trench structures are scaled to smaller and smaller dimensions, this contact resistance is one of the factors dictating the overall performance of the trench structure.

Figure 2:
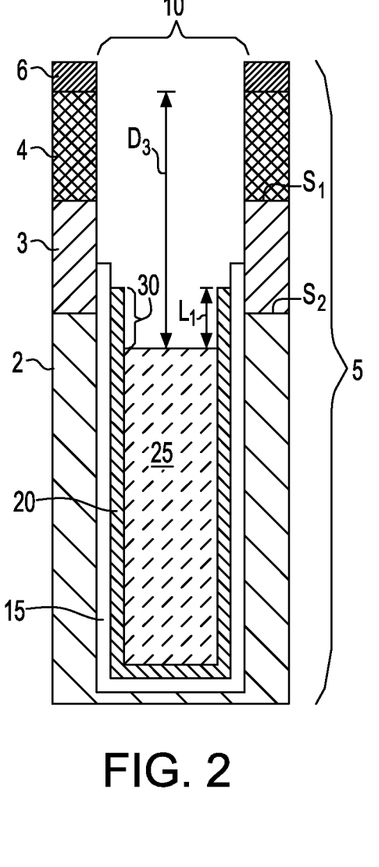
FIG. 2 is a side cross-sectional view of recessing the undoped semiconductor fill material to a second depth within the trench that is greater than a first depth with a second etch, wherein the second etch that is selective to the dielectric layer and the metal containing layer to expose at least a sidewall portion of the metal containing layer, in accordance with one embodiment of the present disclosure.
Figure 3:
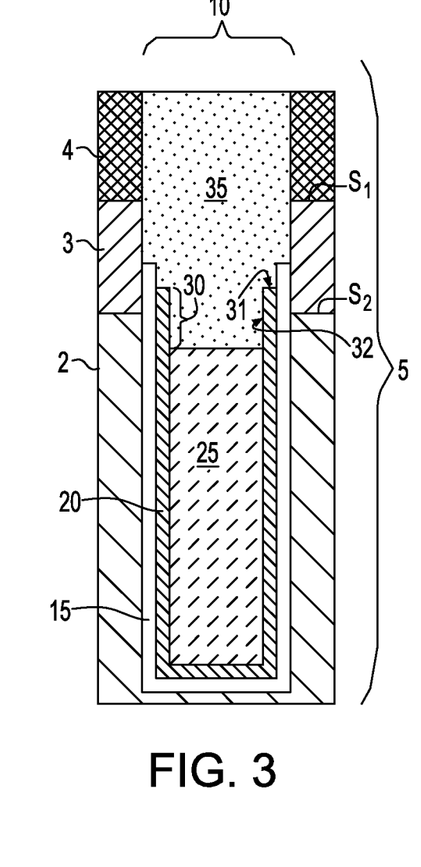
FIG. 3 is a side cross-sectional view depicting forming a doped semiconductor fill material in the trench, wherein the doped semiconductor fill material is in direct contact with the at least the sidewall portion of the metal containing layer, in accordance with one embodiment of the present disclosure.

In some embodiments, the methods and structures disclosed herein reduce the contact resistance between the metal containing layer that is present in the lower portion of the trench and the doped semiconductor fill material that is present in the upper portion of the trench, by contacting a sidewall portion of the metal containing layer in addition to the upper surface of the metal containing layer with the doped semiconductor fill material. By contacting a sidewall portion of the metal containing layer with the doped semiconductor fill material, the contact resistance between the metal containing layer and the doped semiconductor fill material may be reduced to be less than 1 k$\Omega$. One example of process flow for providing a low contact resistance between the doped semiconductor fill material and the metal containing layer is depicted in FIGS. 1-3.

Figure 1:
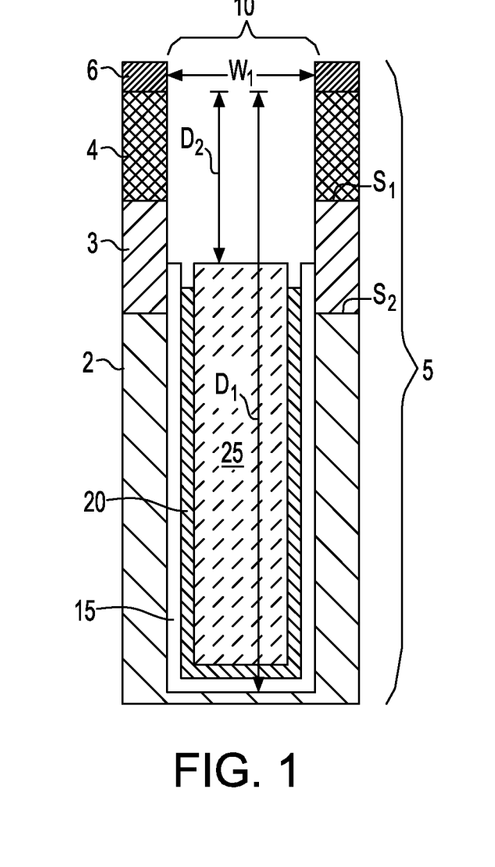
FIG. 1 is a side cross-sectional view depicting forming a trench into a semiconductor substrate, forming a dielectric layer and a metal containing layer on at least the sidewalls of the trench, filling the trench with an undoped semiconductor fill material, and then recessing the undoped semiconductor fill material, the metal containing layer and the dielectric layer to a first depth within the trench with a first etch, in accordance with one embodiment of the present disclosure.

FIG. 1 depicts an initial structure for producing a trench structure. In some embodiments, forming the initial structure may include forming a trench 10 into a semiconductor substrate 5. In some embodiments, the method may begin with forming a pad dielectric stack 6 on the semiconductor substrate 5. In the example depicted in FIG. 1, the semiconductor substrate 5 is a semiconductor on insulator (SOI) substrate that includes a semiconductor on insulator (SOI) layer 4, such as a silicon-containing semiconductor layer, located on a surface of a buried dielectric layer 3, such as a buried oxide layer. Underlying the buried dielectric layer 3 is a lower semiconductor layer, i.e., base semiconductor layer 2. In one embodiment, the SOI layer 4 and the base semiconductor layer 2 are both comprised of silicon (Si). In other embodiments, the SOI layer 4 and/or the base semiconductor layer 2 may include any semiconductor material including, but not limited to, Ge, SiGe, GaAs, InAs, InP, or other III/IV compounds. The SOI layer 4 typically has a thickness greater than 5 nm, e.g., 5 nm to 200 nm. The thickness of the base semiconductor layer 2 may range up to 800 micrometers. In other embodiments, the buried dielectric layer 3 may be any dielectric material, such as an oxide, nitride or oxynitride. In one example, the buried dielectric layer 3 is composed of silicon oxide ($SiO_2$). The thickness of the buried dielectric layer 3 may range from may have a thickness ranging from 10 nm to 500 nm. The SOI substrate may be formed using a bonding process, or it may be formed using an ion implantation process. The SOI substrate may also be formed by depositing the material layers for the SOI layer 4 and the buried dielectric layer 3 on the base semiconductor layer 2, in which the base semiconductor layer 2 may be provided by a bulk substrate. It is noted that it is not intended that the semiconductor substrate 5 be only limited to SOI substrate arrangements, as bulk semiconductor substrates may also be suitable for use with the present disclosure.

The pad dielectric stack 6 includes at least one dielectric layer. The pad dielectric stack 6 may be formed on the surface of the semiconductor substrate 5 using deposition and/or thermal growth processes. The pad dielectric stack 6 may comprise a single pad dielectric layer, or the pad dielectric stack 6 may comprise a multi-layered structure.

An opening is etched through the pad dielectric stack 6 into the semiconductor substrate 5. The pad dielectric stack 6 can be patterned using lithography and etching. In one example, a photolithographic mask (not shown) is produced, by applying a photoresist layer (not shown) on the exposed surface layer of the surface to be etched utilizing a deposition process. The photoresist layer is then patterned utilizing lithography so as to expose selective regions of the pad dielectric stack 6 in which trenches are to be formed. The pattern is then transferred into the layer of the pad dielectric stack 6 using an etching process, such as reactive-ion etching (RIE), ion beam etching, or plasma etching. The opening through the pad dielectric stack 6 may have a width W1 that ranges from 30 nm to 5 µm. In another embodiment, the opening through the pad dielectric stack 6 may have a width W1 that ranges from 1 µm to 20 µm. In some embodiments, the width W1 of the opening through the pad dielectric stack 6 dictates the width W1 of the trench 10.

Thereafter, the exposed portion of the semiconductor substrate 5 is etched to provide the trench 10 having a depth D1 terminating on the base semiconductor layer 2. The trench 10 may be formed using an anisotropic etch process. As used herein, an "anisotropic etch process" denotes a material removal process in which the etch rate in the direction normal to the surface to be etched is higher than in the direction parallel to the surface to be etched. Dry anisotropic etching processes suitable for forming the trench 10 include, but are not limited to, reactive ion etch, ion-beam etching, plasma etching or a combination thereof. Reactive ion etching (RIE) is a form of plasma etching in which during etching the surface to be etched is exposed to reactive gases in the presence of an RF field. The etch process for forming the trench 10 removes the material of the semiconductor substrate 5 selectively to the pad dielectric stack 6. As used herein, the term "selective" in reference to a material removal process denotes that the rate of material removal for a first material is greater than the rate of removal for at least another material of the structure to which the material removal process is being applied. In some examples, the selectivity may be greater than 10:1. In other embodiments, the selectivity may be greater than 100:1. The trench is typically etched through the SOI layer 4 and the buried dielectric layer 3 into the base semiconductor layer 2. Etching of the trench 10 into the base semiconductor layer 2 of the semiconductor substrate 1 may be performed using a timed etch process. In one embodiment, the final depth $D_1$ of the trench 10, as measured from the top surface of the SOI layer 4 is as great as 10 µm. In one example, the final depth $D1_1$ is on the order of about 3 µm to 4 µm. The aspect ratio (height to width ratio) of the trench 10 may range from 20:1 to 100:1. In one example, the aspect ratio of the trench 10 is 30:1.

FIG. 1 further depicts forming a dielectric layer 15 on at least the sidewalls of the trench 10. In some embodiments, the dielectric layer 15 is formed on the sidewalls and the base of the trench 10. The dielectric layer 15 may be composed of any dielectric material, such as oxides, nitrides, and oxynitrides. One example of an oxide that is suitable for the dielectric layer 15 is silicon oxide ($SiO_2$). One example of a nitride that is suitable for the dielectric layer 15 is silicon nitride. In some embodiments, the dielectric layer 15 is composed of a high-k dielectric material. The term "high-k" means that the dielectric constant of the dielectric layer 15 at room temperature, e.g., 20° C. to 25° C., and at atmospheric pressure, e.g., 1 atm, is greater than the dielectric constant of silicon oxide ($SiO_2$). For example, the dielectric constant of a high-k dielectric material may be greater than 4.0. In another embodiment, the dielectric constant of the high-k dielectric material may range from 7 to 40. In some embodiments, the dielectric constant of the high-k dielectric material may be on the order of 100. In one example, a dielectric layer 15 composed of a high-k material is a hafnium-containing dielectric, such as hafnium oxide ($HfO_2$). Other dielectric compositions that are suitable for providing a dielectric layer 15 of a high-k dielectric material may include hafnium silicon oxide, hafnium silicon oxynitride, aluminum oxide, silicon nitride and combinations thereof.

The dielectric layer 15 may be conformally deposited on the sidewalls and base of the trench 10. As used herein, a "conformal layer" is a deposited material having a thickness that remains the same regardless of the geometry of underlying features on which the layer is deposited, wherein the thickness of the layer does not deviate from greater than or less than 20% of an average value for the thickness of the layer. In one embodiment, the dielectric layer 15 may be deposited using chemical vapor deposition (CVD). Variations of CVD processes suitable for providing the dielectric layer 15 include, but are not limited to: Atmospheric Pressure CVD (APCVD), Low Pressure CVD (LPCVD), Plasma Enhanced CVD (EPCVD), Metal-Organic CVD (MOCVD), atomic layer deposition, and combinations thereof. In another example, the dielectric layer 15 is deposited using atomic layer deposition (ALD). In one embodiment, the dielectric layer 15 may have a thickness ranging from 1 nm to 20 nm In another embodiment, the dielectric layer 15 may have a thickness ranging from 1 nm to 3 nm. The dielectric layer 15 may be blanket deposited in the trench 10, and before being recessed in subsequent processing, may be present on the entirety of the base and sidewall surfaces of the trench 10.

In the embodiments of the present disclosure, in which the trench structure is a capacitor, such as the capacitor of a memory device, e.g., embedded dynamic random access (eDRAM) memory device, an electrode (hereafter referred to as "first electrode" or "lower electrode") may be formed in or on the sidewalls and base of the trench 10. In the embodiments, in which the first electrode (not shown) is formed in the sidewalls and base of the trench 10, the portion of the trench 10 that is present in the base semiconductor layer 2 may be doped with an n-type or p-type dopant. In one embodiment, the n-type or p-type dopant that is implanted into the base semiconductor layer 2 may be present in a concentration ranging from $1 \times 10^{14}$ atoms/cm$^3$ to $1 \times 10^{19}$ atoms/cm$^3$. In one example, the dopant source to produce a N+ buried plate diffusion region may be introduced by ion-implantation or gas phase doping. In another example, arsenic doped glass is deposited, e.g., deposited by spin on deposition, on the sidewalls and base of the trench 10, and the n-type or p-type dopant is then diffused from the arsenic doped glass into the sidewalls and base of the trench 10 by thermal annealing. In the embodiments in which the first electrode is deposited on the sidewalls and base of the trench 10, the first electrode may be composed of a metal selected from the group consisting of tungsten (W), titanium (Ti), tantalum (Ta), platinum (Pt), palladium (Pd), Hafnium (Hf), Zirconium (Zr), aluminum (Al) and combinations thereof. The first electrode may also be composed of a metal nitride selected from the group consisting of titanium nitride (TiN), tantalum nitride (TaN), tantalum silicon nitride (TaSiN), or a combination thereof. A first electrode composed of a metal or metal nitride may be deposited within the trench 10 using physical vapor deposition (PVD), such as sputtering, atomic layer deposition (ALD) and/or chemical vapor deposition (CVD). The first electrode may be a conformal layer having a thickness ranging from 1 nm to 20 nm, typically being 3 nm to 7 nm.

FIG. 1 further depicts forming a metal containing layer 20 on the dielectric layer 15 that is present within the trench 20. The term "metal containing" denotes that at least one elemental metal is present in the material layer. The first metal containing layer 20 may be composed of a metal selected from the group consisting of tungsten (W), titanium (Ti), tantalum (Ta), platinum (Pt), palladium (Pd), Hafnium (Hf), Zirconium (Zr), aluminum (Al) and combinations thereof. The metal containing layer 20 may also be composed of a metal nitride selected from the group consisting of titanium nitride (TiN), tantalum nitride (TaN), tantalum silicon nitride (TaSiN), or a combination thereof. A metal containing layer 20 composed of a metal or metal nitride may be deposited within the trench 10 using physical vapor deposition (PVD), such as sputtering, atomic layer deposition (ALD) and/or chemical vapor deposition (CVD). The metal containing layer 20 may be a conformally deposited layer. In one embodiment, the metal containing layer 20 may have a thickness ranging from 1 nm to 20 nm. In another embodiment, the metal containing layer 20 has a thickness ranging from 3 nm to 7 nm. The metal containing layer 20 may be blanket deposited directly on the dielectric layer 15, and before being recessed in subsequent processing, may be present over the entirety of the base and sidewall surfaces of the trench 10. In the embodiments of the present disclosure in which the trench structure is a capacitor, the metal containing layer 20 may provide an electrode (hereafter referred to as "second electrode" or "upper electrode") of the capacitor, wherein the dielectric layer 15 between the first and second electrode is a node dielectric layer.

In some embodiments, following the formation of the metal containing layer 20, an undoped semiconductor fill material 25 is deposited within the trench 10 on the metal containing layer 20. The undoped semiconductor fill material 25 is typically composed of a silicon containing material, such as silicon, single crystal silicon, polycrystalline silicon and combinations thereof. By "undoped" it is meant that the semiconductor fill material 25 is an intrinsic semiconductor material, which does not include n-type or p-type dopants. The undoped semiconductor fill material 25 may include an impurity amount of n-type or p-type dopants that is no greater than $1 \times 10^{16}$ atoms/cm$^3$. The undoped semiconductor fill material 25 may be deposited using chemical vapor deposition (CVD). Variations of CVD processes suitable for providing the dielectric layer 15 include, but are not limited to, Atmospheric Pressure CVD (APCVD), Low Pressure CVD (LPCVD), Plasma Enhanced CVD (EPCVD), Metal-Organic CVD (MOCVD), atomic layer deposition (ALD), and combinations thereof. In some embodiments, deposition of the undoped semiconductor fill material 25 to fill the trench 10 is followed by a planarization step to remove any of the undoped semiconductor fill material 25 that extends over the pad dielectric stack 6. Planarization is a material removal process that employs at least mechanical forces, such as frictional media, to produce a planar surface. One example of a planarization method that is suitable for removing the pad dielectric stack is chemical mechanical planarization (CMP).

FIG. 1 further depicts recessing the undoped semiconductor containing fill 25, the metal containing layer 20, and the dielectric layer 15 to a first depth D2 within the trench 10 with a first etch. In one embodiment, the first depth D2 of the trench 10 is present between the upper surface S1 of the buried dielectric layer 3 and the lower surface S2 of the buried dielectric layer 3. The first etch may remove the material of the dielectric layer 15, the metal containing layer 20 and the undoped semiconductor fill material 25 selectively to the pad dielectric stack 6. The first etch may be an anisotropic etch, such as a reactive ion etch (RIE) or laser etching.

FIG. 2 depicts recessing the undoped semiconductor fill material 25 with a second etch to a second depth D3 within the trench 10 that is greater than a first depth D2. In one embodiment, the second depth D3 of the trench 10 is below the lower surface S2 of the buried dielectric layer 3. The second etch may remove the material of the undoped semiconductor fill material 25 selectively to at least the dielectric layer 15 and the metal containing layer 20. Optionally, the second etch may remove the material of the undoped semiconductor fill material 25 selectively to the pad dielectric stack 6. The second etch may be an anisotropic etch, such as a reactive ion etch (RIE) or laser etching.

Referring to FIG. 2, the second etch exposes a sidewall portion 30 of the metal containing layer 20 that extends above the recessed surface of the undoped semiconductor fill material 25. By "extends above" it is meant that the upper surface of the exposed sidewall portion 30 of the metal containing layer 20 is vertically offset and at a lesser depth from the upper surface of the semiconductor substrate 5 than the recessed surface of the undoped semiconductor material fill 25. In one embodiment, the exposed sidewall portion 30 of the metal containing layer 20 has a length L1 ranging from 30 nm to 1 μm. In another embodiment, the exposed sidewall portion 30 of the metal containing layer 20 has a length L1 ranging from 50 nm to 100 nm. In one embodiment, the parameters of the second etch are selected so that the exposed sidewall has a length L1 of 40 nm or greater.

FIG. 3 depicts one embodiment of forming a doped semiconductor fill material 35 in the trench 10, wherein the doped semiconductor fill material 35 is in direct contact with the at least the sidewall portion 30 of the metal containing layer 20 that was exposed by the second etch that recessed the undoped semiconductor fill material 25. The doped semiconductor fill material 35 is typically composed of a silicon containing material, such as silicon, single crystal silicon, polycrystalline silicon and combinations thereof. The terms "doping" and "doped" denote adding dopant atoms to an intrinsic semiconductor, which changes the electron and hole carrier concentrations of the intrinsic semiconductor at thermal equilibrium. The dopant included in the doped semiconductor fill material may include n-type dopants, p-type dopants or a combination thereof. As used herein, "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to, antimony, arsenic and phosphorous. The dopant may be present in the doped semiconductor fill material 35 in a concentration that is greater than $1 \times 10^{20}$ atoms/cm$^3$. In another embodiment, the concentration of dopant in the doped semiconductor fill material 35 ranges from $1 \times 10^{20}$ atoms/cm$^3$ to $1 \times 10^{21}$ atoms/cm$^3$. In yet another embodiment, the concentration of dopant in the doped semiconductor fill material 25 ranges from $1 \times 10^{20}$ atoms/cm$^3$ to $5 \times 10^{20}$ atoms/cm$^3$. In one example, the doped semiconductor fill material 35 is composed of n-type polysilicon. Following formation of the doped semiconductor fill material 35, the upper surface of the semiconductor substrate 5 may be planarized, e.g., planarized by chemical mechanical planarization (CMP), so that the upper surface of the SOI layer 4 is coplanar with the upper surface of the doped semiconductor fill material 35 that is present in the trench 10. In some embodiments, the planarization process removes the pad dielectric stack 6. In other embodiments, the pad dielectric stack 6 is removed by selective etching.

Still referring to FIG. 3, the direct contact between the doped semiconductor fill material 35 and the upper surface 31 and the sidewall surface 32 of the sidewall portion 30 of the metal containing layer 20 provides a reduced contact resistance between the doped semiconductor fill material 35 and the metal containing layer 20, when compared to similar structures in which the only contact between the doped semiconductor fill material and the metal containing layer is the upper surface of the metal containing layer. In one embodiment, the contact resistance between the metal containing layer 20 and the doped semiconductor fill material 35 may be within the range of 100Ω to 2000Ω. In another embodiment, the contact resistance between the metal containing layer 20 and the doped semiconductor material fill 35 may be within the range of 500Ω to 1000Ω. In some embodiments, it is preferred that the contact resistance between the metal containing layer and the doped semiconductor material fill 35 be as low as possible.

Figure 4:
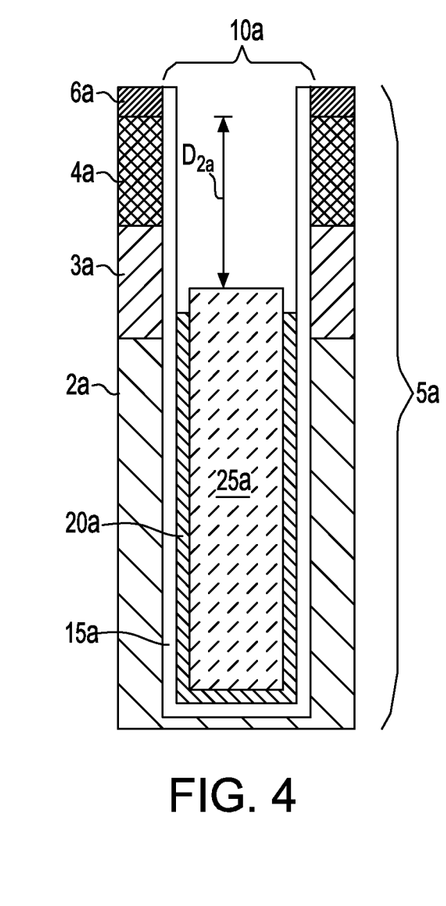
FIG. 4 is a side cross-sectional view of an initial structure of another embodiment of the present disclosure, in which the initial structure is provided by a process sequence that includes forming a trench into a semiconductor substrate, forming a dielectric layer and a metal containing layer on the sidewalls of the trench, filling the trench with an undoped semiconductor fill material, and then recessing the undoped semiconductor fill material and the metal containing layer to a first depth within the trench with a first etch that is selective to the dielectric layer.
Figure 5:
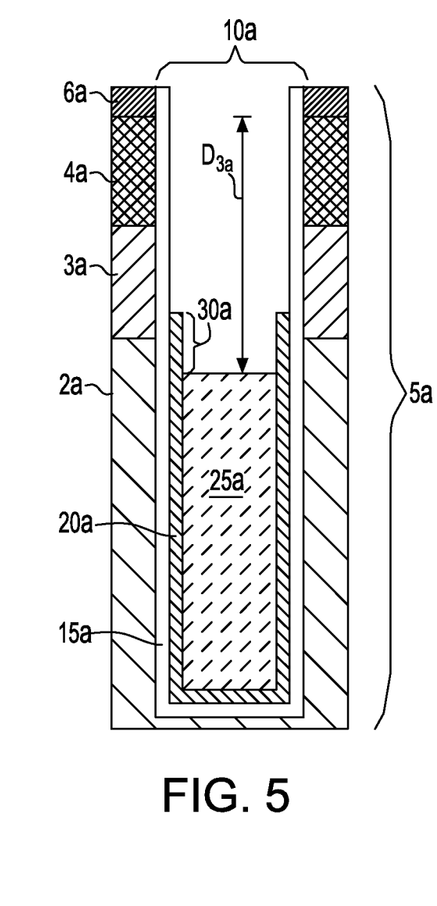
FIG. 5 is a side cross-sectional view depicting a second etch to recess the undoped semiconductor fill material that is depicted in FIG. 4 to a second depth within the trench that is greater than a first depth, wherein the second etch is selective to the metal containing layer and the dielectric layer, in accordance with one embodiment of the present disclosure.
Figure 6:
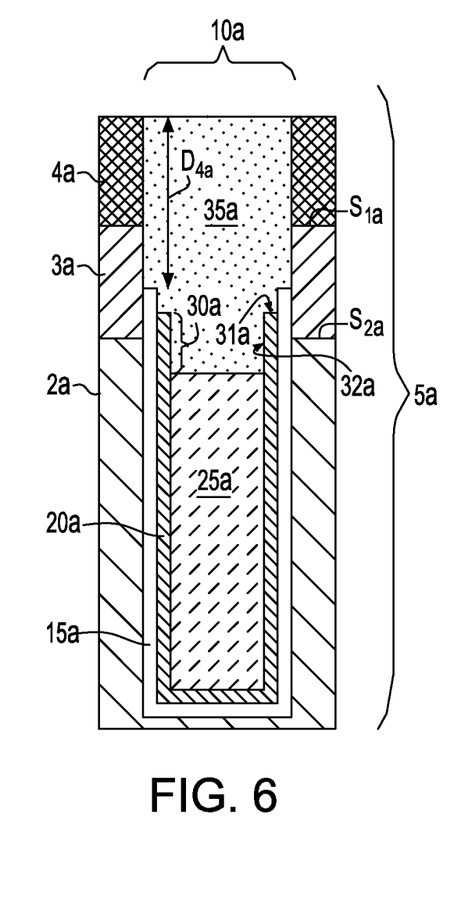
FIG. 6 is a side cross-sectional view depicting a third etch to recess the dielectric layer, and filling the trench with a doped semiconductor containing fill, wherein the doped semiconductor containing fill is in direct contact a sidewall portion of the metal containing layer that was exposed by the second etch depicted in FIG. 5, in accordance with one embodiment of the present disclosure.

FIGS. 4-6 depict another embodiment of the present disclosure. FIG. 4 depicts one embodiment of an initial structure provided by a process sequence that includes forming a trench 10a into a semiconductor substrate 5a, forming a metal containing layer 20a and a dielectric layer 15a on the sidewalls of the trench 10a, and filling the trench 10a with an undoped semiconductor fill material 25a. The semiconductor substrate 5a, the pad dielectric stack 6a, the trench 10a, the dielectric layer 15a, the metal containing layer 20a and the undoped semiconductor containing fill 25a that are depicted in FIG. 4 are similar to the semiconductor substrate 5, the pad dielectric stack 6, the trench 10, the dielectric layer 15, the metal containing layer 20 and the undoped semiconductor containing fill 25 that are depicted in FIG. 1. Therefore, the above description of the semiconductor substrate 5, the trench 10, the dielectric layer 15, the metal containing layer 20 and the undoped semiconductor containing fill 25 made above with reference to FIG. 1 is suitable for the description of the semiconductor substrate 5a, the trench 10a, the dielectric layer 15a, the metal containing layer 20a and the undoped semiconductor containing fill 25a that are depicted in FIG. 4. Further, similar to the semiconductor substrate 5 that is depicted in FIG. 1, the semiconductor substrate 5a depicted in FIG. 4 includes an SOI layer 4a, buried dielectric layer 3a and a base semiconductor layer 2a.

FIG. 4 further depicts recessing the undoped semiconductor fill material 25a and recessing the metal containing layer 20a to a first depth D2a within the trench 10 with a first etch that is selective to the dielectric layer 15a. The first etch to recess the undoped semiconductor fill material 25a and the metal containing layer 20a to the first depth D2a of the trench 10a that is depicted in FIG. 4 is similar to the first etch to recess the undoped semiconductor containing fill 25 and the dielectric layer 20 that is depicted in FIG. 1 with the exception that the first etch depicted in FIG. 4 does not etch the dielectric layer 15a. Therefore, the description of the first etch that is depicted in FIG. 1 is suitable for the first etch that is depicted in FIG. 4 with the exception of the etch chemistry. More specifically, the etch chemistry for the first etch depicted in FIG. 4 is selective to the dielectric layer 15a, as well as optionally being selective to the pad stack dielectric 6a.

FIG. 5 depicts a second etch to recess the undoped semiconductor fill material 25a that is depicted in FIG. 4 to a second depth D3a within the trench 10a that is greater than the first depth D2a. The second etch is selective to the metal containing layer 20a and the dielectric layer 15a and exposes at least a sidewall portion 30a of the metal containing layer 20a. The second etch to recess the undoped semiconductor fill material 25a to the second depth D3a of the trench 10a that is depicted in FIG. 5 is similar to the second etch to recess the undoped semiconductor fill material 25 that is depicted in FIG. 2. Therefore, the description of the second etch that is depicted in FIG. 2 is suitable for the second etch that is depicted in FIG. 5. One structural difference between the embodiments of the present disclosure that are consistent with FIG. 2, and the embodiments of the present disclosure that are consistent with FIG. 5, is that in FIG. 5 the dielectric layer 20a is present along the entire sidewall length of the trench 10a as the undoped semiconductor fill material 25a is recessed to the second depth D3a, whereas in the embodiments consistent with FIG. 2, the dielectric layer 20 was recessed to the first depth D2 during the first etch that is depicted in FIG. 1.

FIG. 6 depicts a third etch that recesses the dielectric layer 15a, and is selective to the undoped semiconductor fill material 25a and the metal containing layer 20a. In one embodiment, the dielectric layer 15a is recessed to a third depth D4a that is less than the first depth D2a. In one embodiment, the third depth D4a of the trench 10a is below the upper surface S1a of the buried dielectric layer 3a and is above the lower surface S2a of the buried dielectric layer 3a. The third etch may remove the material of the dielectric layer 15a selectively to at least the undoped semiconductor fill material 25a and the metal containing layer 20a. Optionally, the third etch may also be selective to the pad dielectric stack 6a. The third etch may be an anisotropic etch, such as reactive ion etch (RIE) or laser etching.

FIG. 6 also depicts filling the trench 10a with a doped semiconductor fill material 35a, wherein the doped semiconductor fill material 35a is in direct contact with the at least the sidewall portion 30a of the metal containing layer 20a that has been exposed by the second etch depicted in FIG. 5. The doped semiconductor fill material 35a that is depicted in FIG. 6 is similar to the doped semiconductor fill material 35 that is depicted in FIG. 3. Therefore, the description of the doped semiconductor fill material 35 that is depicted in FIG. 3 is suitable for the doped semiconductor fill material 35a that is depicted in FIG. 6. Following formation of the doped semiconductor fill material 35a, the upper surface of the semiconductor substrate 5a may be planarized, e.g., planarized by chemical mechanical planarization (CMP), so that the upper surface of the SOI layer 4a is coplanar with the upper surface of the doped semiconductor fill material 35a that is present in the trench 10a. In some embodiments, the planarization process removes the pad dielectric stack 6a. In other embodiments, the pad dielectric stack 6a is removed by selective etching.

Similar to the embodiments described above with reference to FIGS. 1-3, in the embodiments described with reference to FIGS. 4-6, the direct contact between the doped semiconductor fill material 35a and the upper surface 31a and sidewall surface 32a of sidewall portion 30a of the metal containing layer 20a provides a reduced contact resistance between the doped semiconductor fill material 35a and the metal containing layer 20a.

Figure 7:
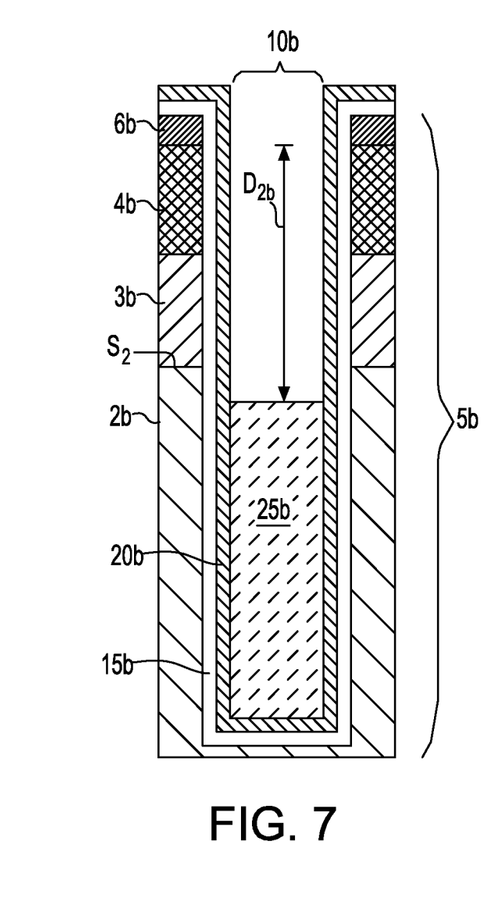
FIG. 7 is a side cross-sectional view of an initial structure of another embodiment of the present disclosure, in which the initial structure is provided by a process sequence that includes forming a trench into a semiconductor substrate, forming a dielectric layer and a metal containing layer on at least the sidewalls of the trench, filling the trench with an undoped semiconductor fill material, and then recessing the undoped semiconductor fill material to a first depth within the trench with a first etch that is selective to the metal containing layer and the dielectric layer.
Figure 8:
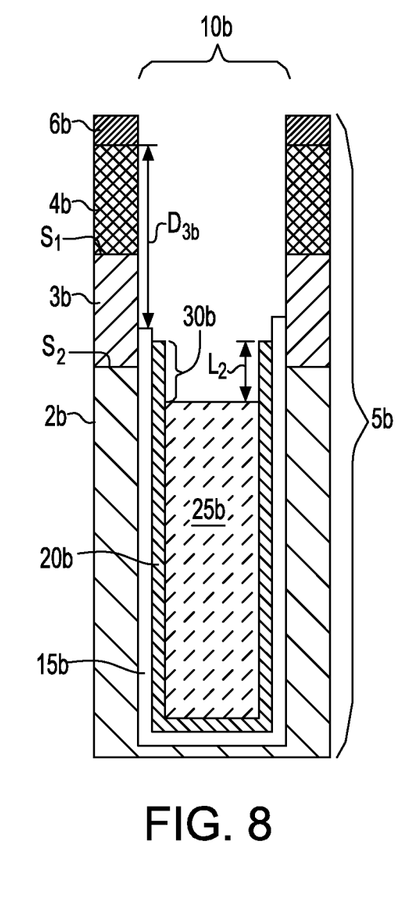
FIG. 8 is a side cross-sectional view depicting a second etch to recess the dielectric layer and the metal containing layer that are depicted in FIG. 7 within the trench to a depth that is less than the recessed depth of the undoped semiconductor fill material, wherein the second etch is selective to the undoped semiconductor fill material, in accordance with one embodiment of the present disclosure.
Figure 9:
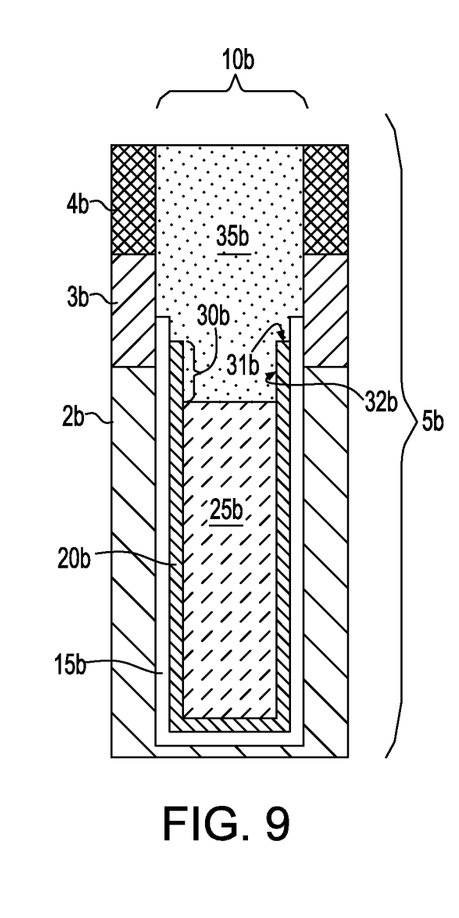
FIG. 9 is a side cross-sectional view depicting a doped semiconductor fill material being formed in the trench depicted in FIG. 8, wherein the doped semiconductor fill material is in direct contact with at least the sidewall portion of the metal containing layer that extends above the recessed undoped semiconductor fill material, in accordance with one embodiment of the present disclosure.

FIGS. 7-9 depict another embodiment of the present disclosure that provides a contact structure between a metal containing layer 20b that is present in the lower portion of the trench 10b and a doped semiconductor fill material 35b that is present in the upper portion of the trench 10b. FIG. 7 depicts an initial structure produced by a process sequence that includes forming a trench 10b into a semiconductor substrate 5b, forming a dielectric layer 15b and a metal containing layer 20b on at least the sidewalls of the trench 10b, and filling the trench 10b with an undoped semiconductor fill material 25b. The semiconductor substrate 5b, the pad dielectric stack 6b, the trench 10b, the dielectric layer 15b, the metal containing layer 20b and the undoped semiconductor containing fill 25b that are depicted in FIG. 7 are similar to the semiconductor substrate 5, the pad dielectric stack 6, the trench 10, the dielectric layer 15, the metal containing layer 20 and the undoped semiconductor containing fill 25 that are depicted in FIG. 1. Therefore, the above description of the semiconductor substrate 5, the trench 10, the dielectric layer 15, the metal containing layer 20 and the undoped semiconductor containing fill 25 that is made above with reference to FIG. 1 is suitable for the description of the semiconductor substrate 5b, the trench 10b, the dielectric layer 15b, the metal containing layer 20b and the undoped semiconductor containing fill 25b that are depicted in FIG. 7.

FIG. 7 further depicts recessing the undoped semiconductor fill material 25b to a first depth D2b within the trench 10b with a first etch that is selective to at least the metal containing layer 20b. In some embodiments, the first etch may also be selective to the dielectric layer 15b. In one embodiment, the first depth D2b of the trench 10b is present below the lower surface S2 of the buried dielectric layer 3b. The first etch may remove the material of the undoped semiconductor fill material 25b selectively to the metal containing layer 20b and pad dielectric stack 6b. The first etch may be an anisotropic etch, such as reactive ion etch (RIE) or laser etching.

FIG. 8 depicts one embodiment of a second etch to recess the exposed portions of the metal containing layer 20b and the dielectric layer 15b that are depicted in FIG. 7 within the trench 10b to a second depth D3b that is less than the recessed depth, i.e., first depth D2b, of the undoped semiconductor fill material 25b. In one embodiment, the second depth D2b of the trench 10b is present between the upper surface S1 of the buried dielectric layer 3b and the lower surface S2 of the buried dielectric layer 3b. The second etch typically removes the material of the dielectric layer 15b and the metal containing layer 20b selectively to the undoped semiconductor fill material 25b. The second etch may also be selective to the pad dielectric stack 6b.

The second etch recesses the metal containing layer 20b to the second depth D3b of the trench 10b that is above the first depth D2b of the trench 20b at which the recessed upper surface of the undoped semiconductor fill material 25b is present. The portion of the metal containing layer 20b that extends above the recessed surface of the undoped semiconductor fill material 25b is the sidewall portion 30b of the metal containing layer 20b that is later contacted by the subsequently formed doped semiconductor fill material. The length L2 of the sidewall portion 30b of the metal containing layer 20b that extends between the first depth D2b of the trench 10b and the second depth D3b of the trench 10b may range from 30 nm to 1 µm. In another embodiment, the length L2 of the sidewall portion 30b of the metal containing layer 20b may range from 50 nm to 100 nm.

FIG. 9 depicts one embodiment of forming a doped semiconductor fill material 35b in the trench 10b depicted in FIG. 8, wherein the doped semiconductor fill material 35b is in direct contact with the at least the sidewall portion 30b of the metal containing layer 20b that extends above the recessed undoped semiconductor containing fill material 25b. The doped semiconductor fill material 35b depicted in FIG. 9 is similar to the doped semiconductor fill material 35b that is depicted in FIG. 3. Therefore, the description of the doped semiconductor fill material 25 that is depicted in FIG. 3 is suitable for the doped semiconductor fill material 35b that is depicted in FIG. 9. Similar to the embodiments described above with reference to FIGS. 1-6, in the embodiments described with reference to FIGS. 7-9, the direct contact between the doped semiconductor fill material 35b and the upper surface 31b and sidewall surface 32b of sidewall portion 30b of the metal containing layer 20b provides a low contact resistance between the doped semiconductor fill material 35b and the metal containing layer 20b.

Figure 10:
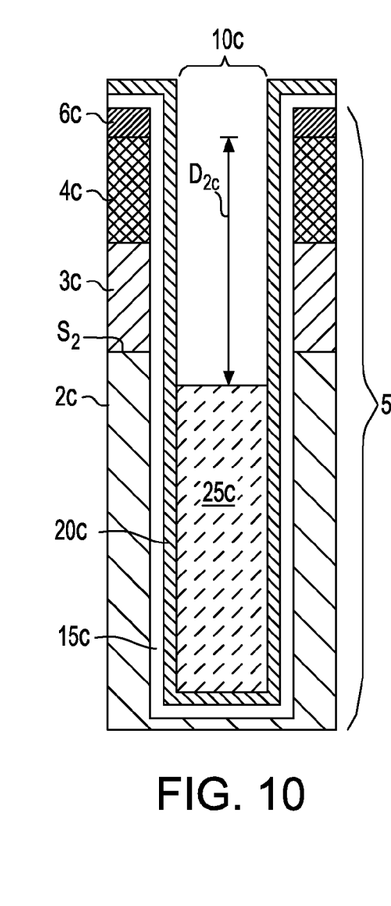
FIG. 10 is a side cross-sectional view of an initial structure of another embodiment of the present disclosure, in which the initial structure is provided by a process sequence that includes forming a trench into a semiconductor substrate, forming a dielectric layer and a metal containing layer on at least the sidewalls of the trench, filling the trench with an undoped semiconductor fill material, and then recessing the undoped semiconductor fill material to a first depth within the trench with a first etch that is selective to the dielectric layer and the metal containing layer.

FIGS. 10-13 depict another embodiment of the present disclosure. FIG. 10 depicts an initial structure that is provided by a process sequence that includes forming a trench 10c into a semiconductor substrate 5c, forming a metal containing layer 20c and a dielectric layer 15c on at least the sidewalls of the trench 10c, filling the trench 10c with an undoped semiconductor containing fill 25c, and then recessing the undoped semiconductor containing fill 25c to a first depth D2c within the trench 10c with a first etch. The first etch is selective to at least the metal containing layer 20c. The first etch may also be selective to the dielectric layer 15c. The aforementioned process flow for forming the initial structure in FIG. 10 is similar to the process flow for forming the initial structure that is depicted in FIG. 7.

Figure 11:
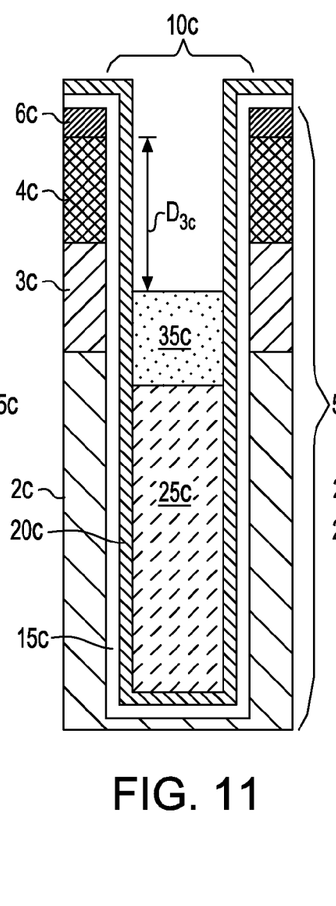
FIG. 11 is a side cross-sectional view of filling the trench depicted in FIG. 10 with a first doped semiconductor fill material, and recessing the first doped semiconductor fill material to a second depth within the semiconductor substrate with a second etch that is selective to the dielectric layer and the metal containing layer, in accordance with one embodiment of the present disclosure.

FIG. 11 depicts filling the trench 10c that is depicted in FIG. 10 with a first doped semiconductor fill material 35c, and recessing the first doped semiconductor fill material 35c to a second depth D3c within the semiconductor substrate 5c with a second etch recesses that is selective to at least the metal containing layer 20c. The second etch may also be selective to the dielectric layer 15c. The second depth D3c is present within the trench 10c at a depth between the upper surface S1 of the buried dielectric layer 3c and the lower surface S2 of the buried dielectric layer 3c. The first doped semiconductor fill material 35c is similar in composition to the doped semiconductor fill material 35 that is depicted in FIG. 3. The first doped semiconductor fill material 35c may be recessed by an etch that removes the material of the first doped semiconductor fill material 35c selectively to the metal containing layer 20c. In one embodiment, the second etch may be an anisotropic etch, such as reactive ion etch (RIE). The portion of the first doped semiconductor fill material 35c that remains following etching is adjacent to the portion of the metal containing layer 20c that is subsequently processed to provide the sidewall portion of the metal containing layer 20c.

Figure 12:
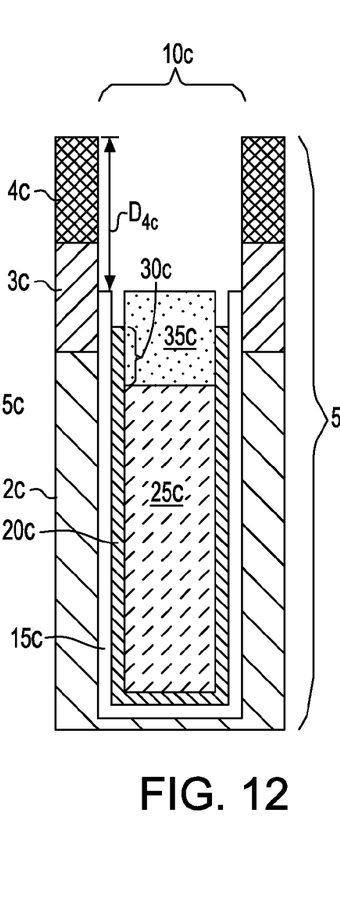
FIG. 12 is a side cross-sectional view depicting recessing the dielectric layer and the metal containing layer within the trench depicted in FIG. 11 with a third etch, wherein the third etch is selective to the first doped semiconductor fill material, in accordance with one embodiment of the present disclosure.

FIG. 12 depicts recessing the metal containing layer 20c and the dielectric layer 15c within the trench 20c depicted in FIG. 11 with a third etch. The third etch is selective to the first doped semiconductor fill material 35c. The third etch recessed the metal containing layer 20c and the dielectric layer 15c to a third depth D4c in the trench 10c that is approximately equal to the second depth D3c in the trench 10c. The third etch may be an anisotropic etch, such as reactive ion etch (RIE) or laser etching. In some embodiments, there may be a difference in etch rate between the metal containing layer 20c and the dielectric layer 15c.

Figure 13:
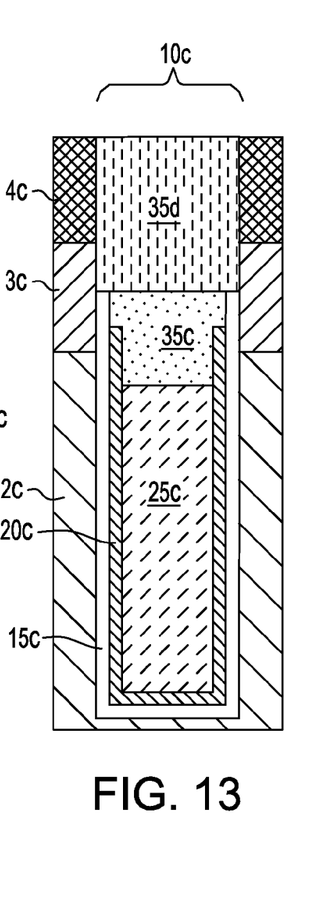
FIG. 13 is a side cross-sectional view depicting filling the trench depicted in FIG. 12 with a second doped semiconductor fill material, in accordance with one embodiment of the present disclosure.

FIG. 13 depicts filling the trench 10c depicted in FIG. 12 with a second doped semiconductor fill material 35d. The second doped semiconductor fill material 35d may be composed of the same or a different material as the first doped semiconductor fill material 35d. The second doped semiconductor fill material 35d depicted in FIG. 13 is similar to the doped semiconductor fill material 35 that is depicted in FIG. 3. Therefore, the description of the doped semiconductor fill material 25 that is depicted in FIG. 3 is suitable for the doped semiconductor fill material 35b depicted in FIG. 9. Similar to the embodiments described above with reference to FIGS. 1-9, in the embodiments described with reference to FIGS. 10-14, the direct contact between the first doped semiconductor fill material 35c and the upper surface 31c and sidewall surface 32c of sidewall portion 30c of the metal containing layer 20c provides a reduced contact resistance between the first doped semiconductor fill material 35c and the metal containing layer 20c.

Figure 14:
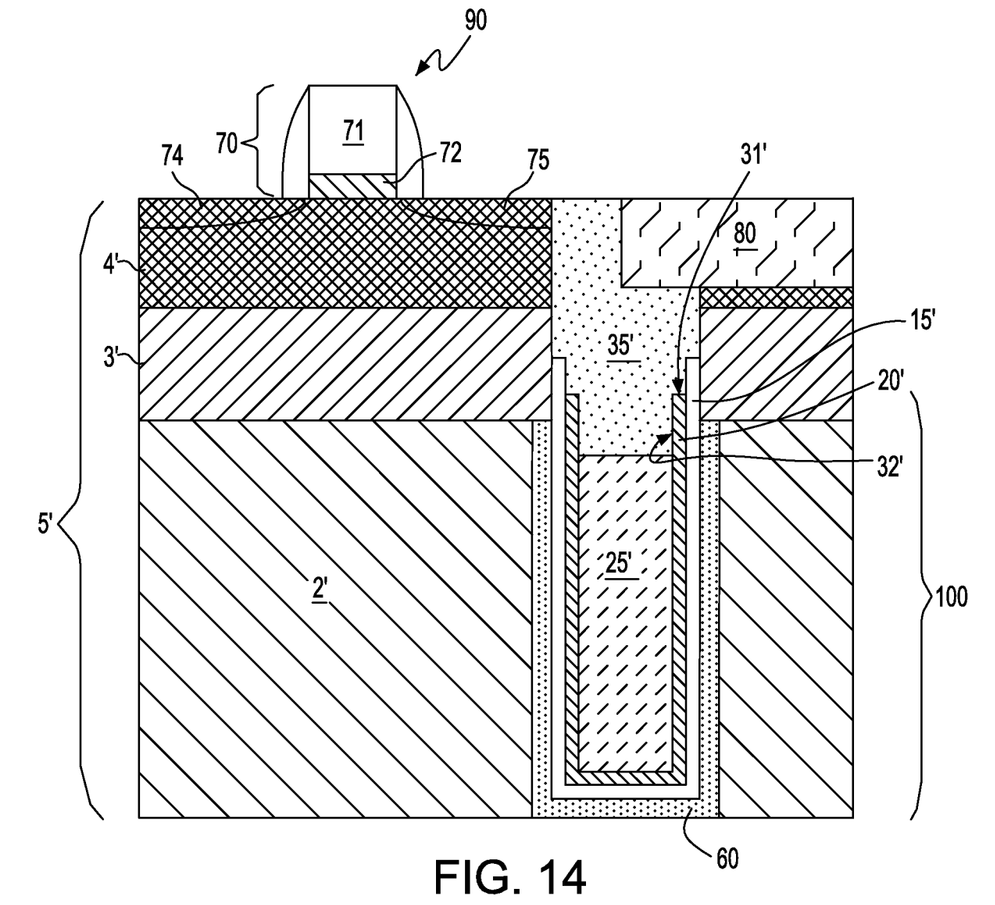
FIG. 14 is a side cross-sectional view depicting a memory device including a capacitor formed in accordance with the present disclosure.

Referring to FIG. 14, the trench structures described above in FIG. 1-13 may be employed in the capacitor 100 of a memory device, in which the upper electrode of the capacitor 100 of the memory device is provided by the metal containing layer 20, 20a, 20b, 20c (hereafter referred to as upper electrode 20' in FIG. 14), the node dielectric layer is provided by dielectric layer 15a, 15b, 15c, 15d (hereafter referred to as node dielectric layer 15' in FIG. 14), and the lower electrode 60 of the capacitor is provided by a doped portion of the sidewalls and base of the trench. The capacitor 100 also includes an undoped semiconductor fill material 25' present in a lower portion of the trench. The undoped semiconductor fill material 25' depicted in FIG. 14 is similar to the undoped semiconductor fill material 25, 25a, 25b, 25c that has been described above with reference to FIGS. 1-13. The semiconductor substrate 5' depicted FIG. 14 includes a semiconductor on insulator (SOI) layer 4', a buried dielectric layer 3', and a base semiconductor layer 2'. The memory device may also include an access transistor 90 in electrical communication with the trench capacitor 100. In one embodiment, at least one access transistor 90 is formed on the SOI layer 4' in electrical communication with the trench capacitor 30. In one embodiment, each of the access transistors 90 is a field effect transistor (FET), such as an n-type and/or p-type FET. Each field effect transistor (FET) may include a source region 74 and a drain region 75 and a gate structure 70. The gate structure 70 may include at least one gate dielectric layer 72 and at least one gate conductor 73. In one embodiment, an isolation region 80, such as a trench top oxide (TTO), is formed overlying the trench capacitor 100.

Typically, at least one of the source region 74 and the drain regions 75 of the access transistor 90 is in electrical communication with the upper electrode 20' of the trench capacitor 100. Electrical communication of the access transistor 90 to the upper electrode 20' of the capacitor 100 is through a doped semiconductor fill material 35' that is present in the upper portion of the trench, and is in direct contact with a sidewall surface 32' and an upper surface 31' of the sidewall portion 30' of the upper electrode 20'. The doped semiconductor fill material 35' has been described above as the doped semiconductor fill material 35, 35a, 35b, 35c, 35d with reference to FIGS. 1-13. Similar to the embodiments described above with reference to FIGS. 1-13, the direct contact between the doped semiconductor fill material 35' and the upper surface 31' and sidewall surface 32' of sidewall portion 30' of the upper electrode 20' provides a low contact resistance between the doped semiconductor fill material 35' and the upper electrode 20'. For example, the contact resistance between the between the upper electrode 20' and the doped semiconductor material fill 35' may be within the range of 100Ω to 2000Ω. In another example, the contact resistance between the between the upper electrode 20' and the doped semiconductor material fill 35' may be within the range of 500Ω to 1000 n. In some embodiments, it is preferred that the contact resistance between the upper electrode 20' and the doped semiconductor material fill 35' be as low as possible.

Figure 15:
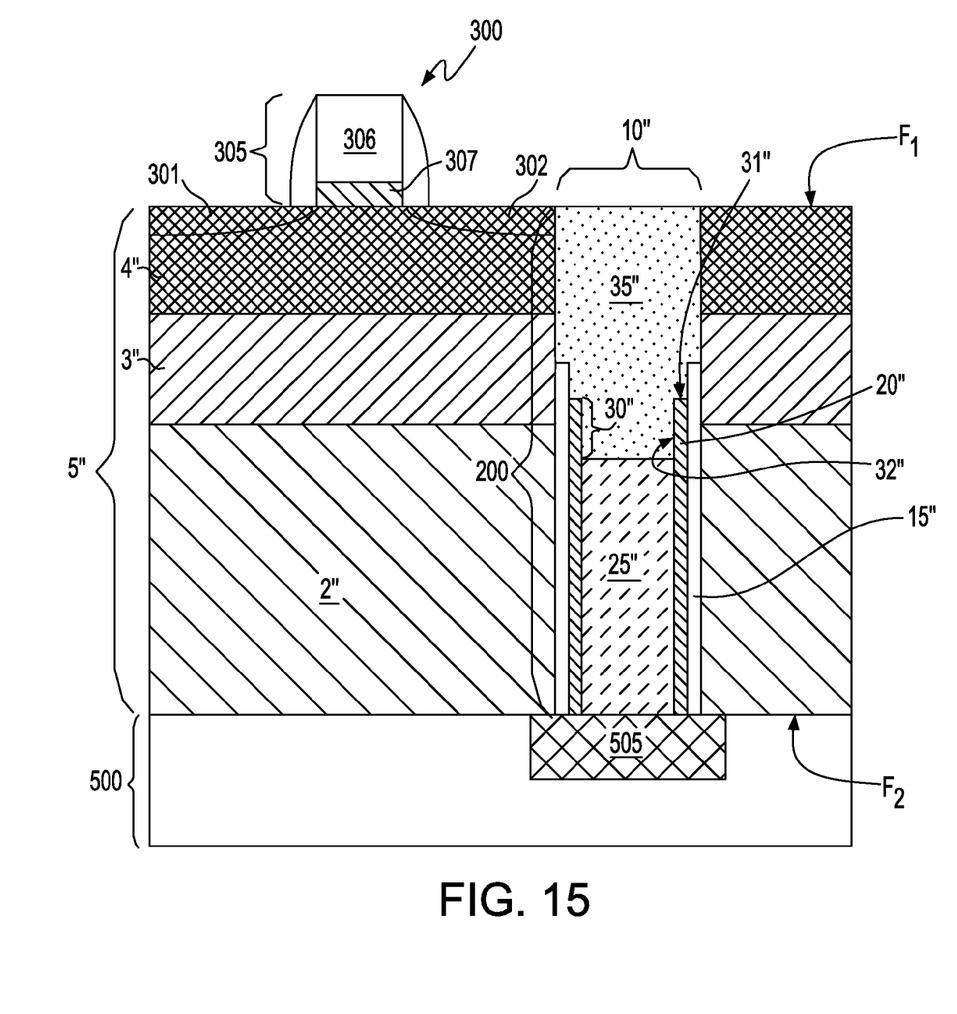
FIG. 15 is a side cross-sectional view depicting a through substrate via (TSV) structure formed in accordance with the present disclosure.

FIG. 15 depicts another structure that may be formed using the methods disclosed in FIGS. 1-13. FIG. 15 depicts a through substrate via (TSV) structure 200 that has been formed in accordance with the present disclosure. The TSV structure 200 provides electrical communication from one face F1 of a semiconductor substrate 5" to an opposite face of the semiconductor substrate 5". The semiconductor substrate 5" may include an SOI layer 4", a buried dielectric layer 3" and a base semiconductor layer 2", wherein these elements of the semiconductor substrate 5" have also been described above with reference to FIGS. 1-13.

The TSV structure 200 may be formed in accordance with any of the methods disclosed in FIGS. 1-13, and may include an undoped semiconductor fill material 25", a metal containing layer 20", a dielectric layer 15", and a doped semiconductor fill material 35", wherein these elements have been described above with reference to FIGS. 1-13. The metal containing layer 20" is an electrically conductive element that is being contacted by the doped semiconductor fill material 35" for transmitting current from the first face F1 of the semiconductor substrate 5" to the second face F2 of the semiconductor substrate 5". The doped semiconductor fill material 35" that is present in the upper surface of the trench, and is in direct contact with a sidewall surface 32" and an upper surface 31" of the sidewall portion 30". Similar to the embodiments described above, the direct contact between the doped semiconductor fill material 35" and the upper surface 31" and sidewall surface 32" of sidewall portion 30" of the metal containing layer 20" provides a low contact resistance between the doped semiconductor fill material 35" and the metal containing layer 20". For example, the contact resistance between the between the metal containing layer 20" and the doped semiconductor material fill 35" may be within the range of 100Ω to 2000Ω. In another example, the contact resistance between the between the metal containing layer 20", and the doped semiconductor material fill 35" may be within the range of 500Ω to 1000Ω. In some embodiments, it is preferred that the contact resistance between the metal containing layer 20" and the doped semiconductor material fill 35" be as low as possible.

To provide the TSV structure depicted in FIG. 15, the back surface of the semiconductor substrate 5" is planarized or etched to expose the base surface of the undoped semiconductor fill material 25". The planarization step removes the base surface of the dielectric layer 15" and may remove the back surface of the metal containing layer 20". Following planarization, the back surface of metal containing layer 20" is coplanar with the back surface of the undoped semiconductor fill material 25". Following planarization, a second substrate 500 which may include an electrical structure is bonded to the planarized surface of the semiconductor substrate 5". The bonding between the semiconductor substrate 5" and the second substrate 500 is provided by adhesive bonding or thermal bonding. The metal containing layer 20" provides for electrical communication through the trench 10" to the electrical structure that is present on the second substrate 500.

In one embodiment, the electrical structure of the second substrate 500 is a conductive line 505, as depicted in FIG. 15. It is not intended that the electrical structure of the second substrate 500 be limited to only the structure depicted in FIG. 15, as other electrical structures are within the scope of the present disclosure. Other examples of electrical structures that may be present on the second substrate 500 also include semiconductor devices, such as field effect transistors, and memory devices, such as eDRAM structures. A semiconductor device 300 may also be formed on the SOI layer 4" of the semiconductor substrate 5". The semiconductor device 300 that is depicted in FIG. 15 is a field effect transistor (FET), such as an n-type and/or p-type FET. Each field effect transistor (FET) may include a source region 301 and a drain region 302 and a gate structure 305. The gate structure 305 may include at least one gate dielectric layer 307 and at least one gate conductor 306. It is not intended that the semiconductor device 200 be limited to only the structure depicted in FIG. 15, as other semiconductor device 300 is within the scope of the present disclosure. The semiconductor device 300 and the electrical structure 505 may be formed prior to bonding of the semiconductor substrate 5" to the second substrate 500.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A trench structure comprising:
   a trench in a semiconductor on insulator (SOI) substrate, wherein said trench extends from a surface of a semiconductor on insulator (SOI) layer of said SOI substrate through a buried dielectric layer of said SOI substrate into a base semiconductor layer of said SOI substrate;
   an undoped semiconductor material fill present in a lower portion of said trench that is located in said base semiconductor layer;
   a dielectric layer present on sidewalls of said trench and extending from a portion of said buried dielectric layer into said base substrate layer;
   a metal containing layer present on said dielectric layer, wherein a contact portion of said metal containing layer extends above an upper surface of said undoped semiconductor material fill; and
   a doped semiconductor material fill present in said trench extending from an upper portion of said trench that extends through said SOI layer of said SOI substrate into contact with said contact portion of said metal containing layer.

2. The trench structure of claim 1, wherein said doped semiconductor fill material comprises a p-type or n-type dopant in a concentration greater than $1\times10^{20}$ atoms/cm$^3$, and said undoped semiconductor fill material has a maximum n-type or p-type dopant concentration that is no greater than $1\times10^{16}$ atoms/cm$^3$.

3. The trench structure of claim 1, wherein said metal containing layer is composed of a metal selected from the group consisting of copper, aluminum, platinum, silver, tungsten, titanium, tantalum and combinations thereof.

4. The trench structure of claim 1, wherein said trench structure is a memory device.

5. The trench structure of claim 4, wherein said memory device comprises an access transistor that is in electrical communication with a capacitor that is present in said trench.

6. The trench structure of claim 5, wherein said capacitor comprises a plate electrode provided by a doped portion of said SOI substrate at said sidewalls and a base of said trench, a node dielectric provided by said dielectric layer that is present on said base and sidewalls of said trench, and an upper electrode provided by said metal containing layer.

7. The trench structure of claim 5, wherein said access transistor is present on said SOI layer and includes a source region, a drain region, and a gate structure.

8. The trench structure of claim 7, wherein said access transistor is in electrical communication with said capacitor through at least one of said source region and said drain region.

9. The trench structure of claim 1, wherein said trench has an aspect ratio of from 20:1 to 100:1.

10. The trench structure of claim 1, wherein said dielectric layer comprises a dielectric material having a dielectric constant of greater than silicon oxide.

11. The trench structure of claim 1, wherein said dielectric layer is a conformal dielectric layer.

12. The trench structure of claim 1, wherein said metal containing layer is composed of a metal nitride.

13. The trench structure of claim 1, wherein said metal containing layer is a conformal metal containing layer.

14. The trench structure of claim 1, wherein said doped semiconductor fill material is a silicon-containing material.

15. The trench structure of claim 14, wherein said silicon-containing material is single crystalline.

16. The trench structure of claim 1, wherein a contact resistance between the metal containing layer and said doped semiconductor fill is from 100Ω to 2000Ω.

* * * * *